United States Patent [19]

Brunolli

[11] Patent Number: 4,905,189

[45] Date of Patent: Feb. 27, 1990

[54] SYSTEM FOR READING AND WRITING INFORMATION

[75] Inventor: Michael J. Brunolli, Escondido, Calif.

[73] Assignee: Brooktree Corporation, San Diego, Calif.

[21] Appl. No.: 810,911

[22] Filed: Dec. 18, 1985

[51] Int. Cl.[4] ................................................ G11C 7/00

[52] U.S. Cl. ................................ 364/900; 364/927.2; 364/065.9; 364/950.0; 364/948.3; 364/965.0; 365/189.01; 365/189.04

[58] Field of Search .................. 364/200 MS, 900 MS

[56] References Cited

U.S. PATENT DOCUMENTS

| | | | |
|---|---|---|---|
| 4,220,997 | 9/1980 | Hager | 364/900 |
| 4,310,878 | 1/1982 | Hyatt | 364/183 |
| 4,394,726 | 7/1983 | Kohl | 364/200 |
| 4,396,976 | 8/1983 | Hyatt | 364/167 |
| 4,420,819 | 12/1983 | Price et al. | 364/900 |
| 4,443,855 | 4/1984 | Bishop et al. | 364/513 |
| 4,456,965 | 6/1984 | Graber et al. | 364/900 |
| 4,471,456 | 9/1984 | Branigin et al. | 364/900 |
| 4,485,450 | 11/1984 | Characklis et al. | 364/550 |
| 4,541,076 | 9/1985 | Bowers et al. | 365/195 |
| 4,627,018 | 12/1986 | Trost et al. | 364/900 |
| 4,719,596 | 1/1988 | Bernstein et al. | 365/189 |

*Primary Examiner*—Gareth D. Shaw
*Assistant Examiner*—Maria Napiorkowski
*Attorney, Agent, or Firm*—Ellsworth R. Roston; Charles H. Schwartz

[57] ABSTRACT

First binary bits are read synchronously relative to clock signals (e.g. 125 $MH_z$) from first memory positions and second binary bits are read from, or written in, second memory positions asynchronously relative to the clock signals without affecting the reading of the first memory bits. For synchronously reading the first bits, a plurality of channels are sequentially activated at a suitable frequency (e.g. 25 megahertz). Information from pairs of data lines are introduced into a pair of buses at the clock frequency. The information in the buses is sampled upon the occurrence of the first polarity in synchronizing signals having frequency (e.g. 62.5 $MH_3$) derived from the clock signals and is prolonged and evaluated in a first pair of output lines upon the occurrence of the second polarity in the synchronizing signals. The information being evaluated is introduced to such output lines during the occurrence of the first polarity in the synchronizing signals. The evaluated signals on such output lines are then neutralized upon the occurrence of the first polarity in such synchronizing signals. Similarly, the information in the buses is sampled upon the occurrence of the second polarity in the synchronizing signals and is prolonged and evaluated in a second pair of output lines upon the occurrence of the first polarity in the synchronizing signals. The evaluated signals on all of the output lines are then processed on an exclusive basis to insure that only one of the evaluated signals can be introduced at any one time to a resultant line.

40 Claims, 4 Drawing Sheets

+5v
VPB
136
132
+5v
128
124
80
VOLTAGE SOURCE
94
+5v
122
120
60
66
62
FBLn
SBLn
SBLn
+5v
FBLCn
YPB
138
134
+5v
130
126
64
FBLn

VOLTAGE SOURCE
94
VPB
157
160
FDBx
154
DATA
INVERTED DATA
FDBx
158
140a
142
146
140b
144
148
140c
150
154
140d
152
156
132
134
132a
134a
132b
134b
132c
134c
(1)
(2)
(3)
(4)
(5)
(6)
(7)
(8)
FBLCn
FBLCn
FBLCn+1
FBLCn+1
FBLCn+2
FBLCn+2
FBLCn+3
FBLCn+3

VOLTAGE SOURCE
94
+5v
+5v
SYNCHRONIZING
40
220
222
224
226
DLx
214
+5v
+5v
204
DLx
228
154
200
FDBx
VDIFF
242
240
FDBx
158
202
216
210
206
208
218
80
250
46
252
DUPLICATION OF ABOVE CIRCUITRY
DRx
DRx
254

94
VOLTAGE SOURCE
280
284
276
272
282
DLx
254
274
DRx
228
252
270
DLx
DRx
226
278
288

SYSTEM FOR READING AND WRITING INFORMATION

SYNOPSIS OF THE INVENTION

This invention relates to a system for reading information from a random access memory and writing information in such a memory. The invention further relates to a system for providing such reading and/or writing at relatively high frequency of at least one hundred and twenty five (125) megahertz. The invention particularly relates to a system for simultaneously reading binary coded information from a random access memory on a synchronous basis relative to clock signals at a suitable frequency such as approximately one hundred twenty five (125) megacycles and simultaneously reading binary coded information from, or recording binary coded information in, the random access memory on an asychronous basis relative to the clock signals.

BACKGROUND OF THE INVENTION

Random access memories are provided for storing binary coded information. These memories are versatile because the binary information at different positions in the memory can be read from the memory and because binary coded information can be written in the memory at any desired position to update information previously stored in the memory at such positions. The information read from the memory can be processed by a digital computer or a data processor to obtain certain desired operations such as the movements of a control mechanism and the information written into the memory to update the memory may be obtained from the actual movements of the control mechanism. In this way, any differences between the actual and desired movements of the control mechanism can be corrected.

Random access memories now in use have certain limitations. These result in large part from limitations in the operation of the system associated with the memory for reading information from the memory or writing information in the memory. One of these limitations results from the inability of the system simultaneously to read information from one position in the memory and write information into a second position in the memory. A further limitation results from the limited speed in reading information from the memory or writing information in the memory. This limited speed in turn curtails the speed at which the digital computer or data processing system associated with the memory is able to process information. A third limitation results from the inability of the system to read binary coded information from the memory on a synchronous basis relative to the clock signals and simultaneously read binary coded information from, or record binary coded information in, the memory on an asynchronous basis relative to the clock signals.

A considerable effort has been made over an extended number of years to provide a random access memory system which will overcome the limitations discussed in the previous paragraph. Such effort has been particularly intent in view of the rapid expansion in the uses and perfection of data processing. In spite of such efforts, the capabilities of the random access memory systems still trail the capabilities of the associated data processors and accordingly impose limitations on the operation of these data processors.

SUMMARY OF THE INVENTION

This invention provides a read-write system which is capable of operating with a random access memory to overcome the limitations discussed previously. The system of this invention also provides for the reading of first bits of information from the memory at first positions on a synchronous basis relative to clock signals (e.g. 125 MHz) and the simultaneous reading of second bits of information from, or writing of second bits of information in, the memory at second positions on an asynchronous basis relative to the clock signals without affecting the reading of the first bits of information from the memory.

The system of this invention provides for the sequential activation of a plurality of channels at a reduced frequency, such as twenty five megahertz (25 mhz), in each channel. The system further provides for the introduction to a pair of buses of information from a plurality of pairs of data lines at a frequency corresponding to a clock frequency of one hundred and twenty five megahertz (125 mhz).

The information in the pair of buses is sampled upon the occurrence of a first polarity in synchronizing signals derived from the clock signals and having a frequency of sixty two and one-half megahertz (62.5 mhz) and is evaluated upon the occurrence of a second polarity in the synchronizing signals. The information being evaluated is introduced to a first pair of output lines during the occurrence of the first polarity in the synchronizing signals. The evaluation of the information is prolonged during the the occurrence of the second polarity in the synchronizing signals. The information being evaluated as represented by the signals on the first pair of output lines is then neutralized upon the next occurrence of the first polarity in such synchronizing signals. Similarly, the information in the pair of buses is sampled upon the occurrence of the second polarity in the synchronizing signals and is evaluated in a second pair of output lines upon the occurrence of the first polarity in the synchronizing signals. The evaluated signals on the first and second pairs of output lines are then processed on an exclusive basis to insure that only one of the evaluated signals can be introduced at any one time to a resultant line.

DETAILED DESCRIPTION OF THE DRAWINGS

Figure 1:
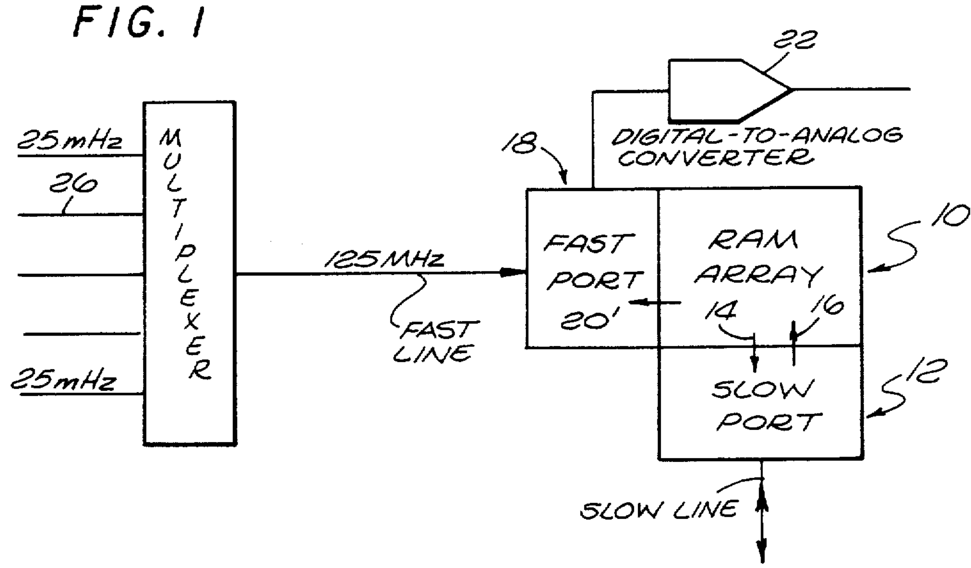
FIG. 1 is a schematic block diagram of a random access memory and of a system for reading first bits of information from first positions in the memory on a synchronous basis relative to clock signals and simultaneously reading second bits of information from, or writing second bits of information in, second positions in the memory on an asynchronous basis relative to clock signals without having the reading of the first bits of information from the memory affect the reading or writing of the second bits of information.

FIG. 1 illustrates one embodiment of the invention in block form. The embodiment shown in FIG. 1 includes a random access memory generally indicated at 10. The random access memory is adapted to store a plurality of bits of binary coded information in an array in which the position of each binary coded bit in the array is identified by an individual distance along a pair of coordinate axes such as an x-axis and a y-axis. The random access memory is adapted to provide an erasable storage of binary coded information in which the binary coded information at different positions in the memory can be constantly updated. Random access memories are commercially available which can store tens, and even hundreds, of thousands of bits of binary coded information in an array in a relatively small area. The binary coded information may be represented by logic levels of signals in which a first logic level or amplitude represents a binary "1" and a second logic level represents a binary "0".

A slow port generally indicated at 12 is associated with the random access memory 10. The port 12 is adapted to read information from specified positions in the memory 10 or to write binary information in specified positions in the memory. The reading of such binary coded information from the memory 10 is indicated by an arrow 14 and the writing of such information in the memory is indicated by an arrow 16. The reading and writing of such binary coded information may occur on an asynchronous basis relative to clock signals at a suitable frequency such as 125 megahertz.

A fast port generally indicated at 18 is also associated with the memory 10. As indicated by an arrow 201, the fast port 18 is adapted to read information from the memory 10 on a synchronous basis relative to the clock signals at a relatively high frequency such as frequencies of at least 125 megahertz. This frequency is considerably higher than the frequency of the signals in the slow port 12. The signals read in the fast port 18 may be introduced to a digital-to-analog converter 22 which converts the binary signals from the fast port 18 into corresponding analog signals for subsequent processing.

In order to obtain the reading of signals in the fast port 18, the operation of the fast port 18 may be controlled as by a multiplexer 24. The multiplexer 24 produces signals at a reduced frequency, such as approximately twenty-five megahertz (25 mhz), on a plurality (such as 5) of lines 26. The signals in each of the lines 26 are shifted in phase relative to the signals in the other ones of the lines 26. When these signals are combined in the multiplexer 24, the output of the multiplexer is at approximately 125 megacycles.

Figure 2:
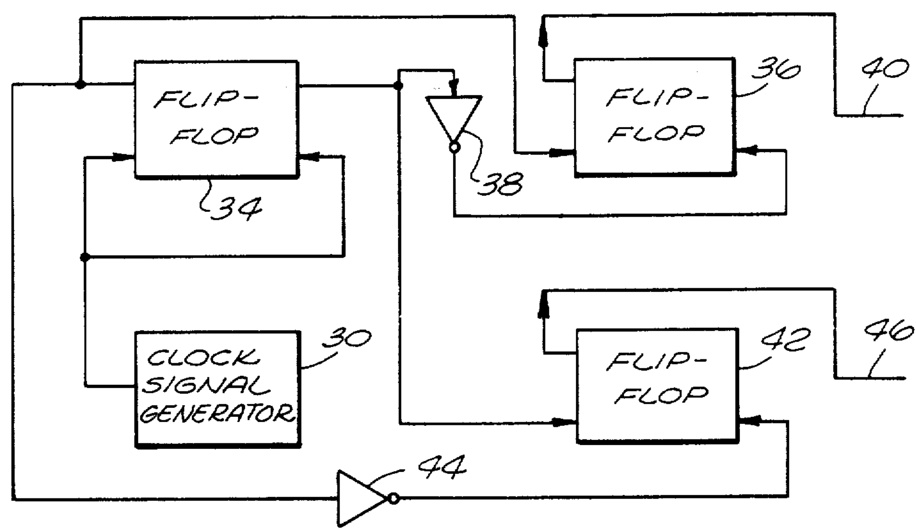
FIG. 2 is a block diagram of a system for producing synchronizing signals for use in the read-write system of FIG. 1.
Figure 3:
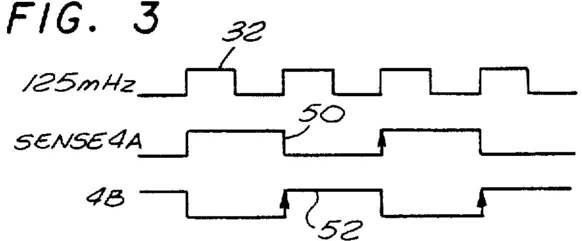
FIG. 3 illustrates waveforms of clock signals which are produced by the system shown in FIG. 2.

FIG. 2 illustrates in block form a system for generating clock signals. The system shown in FIG. 2 includes a clock signal generator 30 which produces signals at a particular frequency such as one hundred and twenty-five megahertz (125 mhz). These signals are illustrated at 32 in FIG. 3. The signals from the clock generator 30 are introduced to true and false input terminals of a flip-flop 34 also having true and false output terminals. The true output terminal of the flip-flop 34 is connected to the true input terminal of a flip-flop 36. The false output signals from the flip-flop 34 are amplified and inverted by an amplifier-inverter 38 and are introduced to the false input terminal of the flip-flop 36. An output line 40 extends from the false output terminal of the flip-flop 36.

Similarly, a connection is made from the false output terminal of the flip-flop 34 to the true input terminal of a flip-flop 42. The false input terminal of the flip-flop 42 receives the signals from an amplifier-inverter 44 corresponding in construction and operation to the amplifier-inverter 38. The operation of the amplifier-inverter 44 is controlled by the signals on the true output terminal of the flip-flop 34. The true output terminal of the flip-flop 42 is connected to an output line 46.

The flip-flop 34 is alternately triggered to the true and false states when the signal 32 changes from a negative polarity to a positive polarity. The flip-flop 34 accordingly produces the signals 32 in FIG. 3. When the flip-flop 34 is triggered to the true state, it triggers the flip-flop 36 to the true state. In the rising amplitude of the next cycle of the clock signals 32, the flip-flop 34 is again triggered to the true state. This causes a negative signal to be produced on the false terminal of the flip-flop 34. This signal is inverted by the amplifier-inverter 38 to trigger the flip-flop 36 to the false state. In this way, synchronizing signals are produced on the output terminal 40 with a frequency one-half (½) that of the clock signals 32 and with a polarity as indicated at 50 in FIG. 3. The flip-flop 42 also produces synchronizing signals 52 with a frequency one-half (½) that of the clock signals 32 but with a polarity opposite to the polarity of the signals 50 in FIG. 3. The signals 52 produced by the flip-flop 42 are introduced to the line 46.

Figure 4:
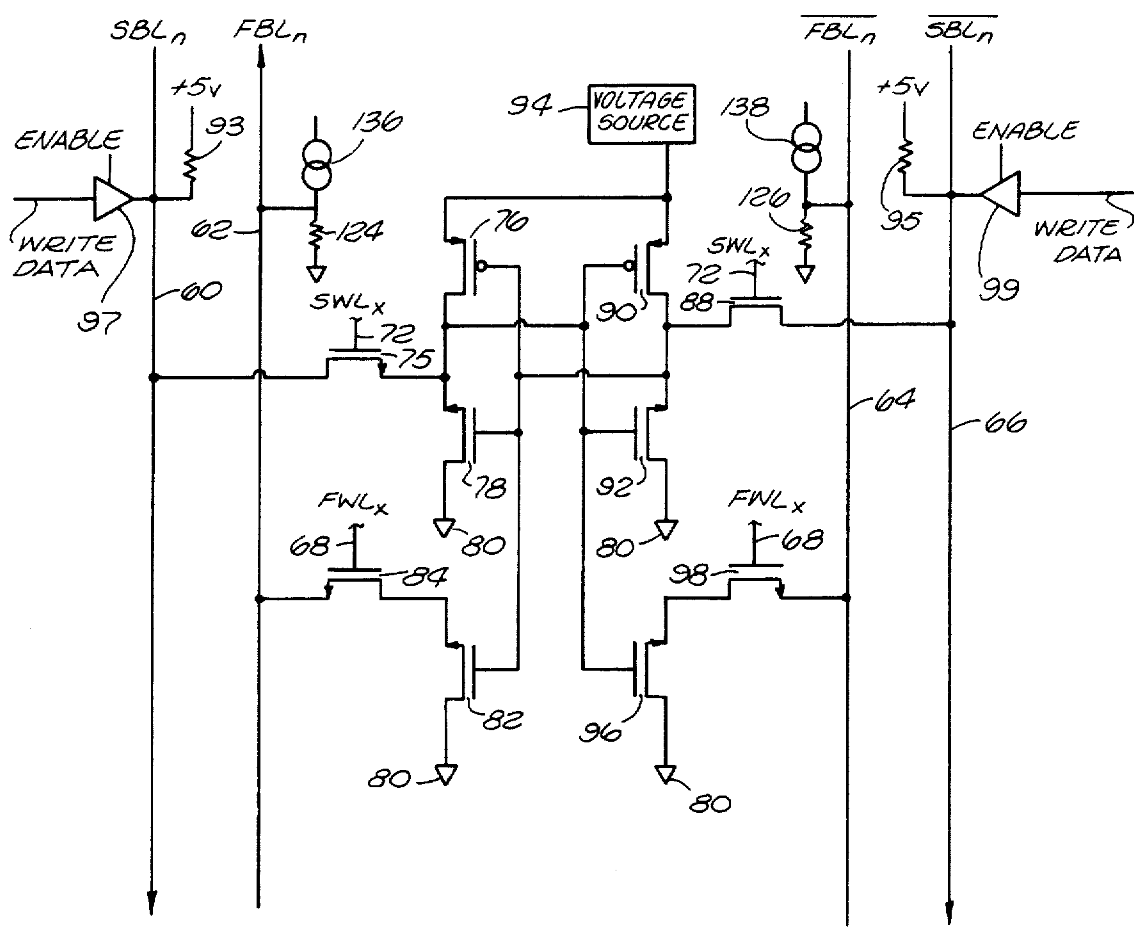
FIG. 4 is a diagram of circuitry which is used in the read-write system shown in FIG. 1 to read first bits of information from a first position in the memory and simultaneously read second bits of information from, or write second bits of information in, second positions in the memory without having the reading of the first bits of information from the memory affect the reading or writing of the second bits of information.

FIG. 4 illustrates circuitry for reading information in the fast port 18 and reading information in, or recording information from, the slow port 12 in FIG. 2. The circuitry shown in FIG. 4 provides for the processing of information in the slow port 12 without any interference from the reading of information in the fast port 18. The circuitry shown in FIG. 4 includes lines 60, 62, 64, 66, 68 and 72. The lins 60 and 66 provide signals respectively coded for logic states of "true" and "false" in a binary bit to be processed in the slow port 12. These signals are respectively indicated as "$SBL_n$" and "$\overline{SBL}_n$". Similarly, the lines 62 and 64 provide signals respectively coded for logic states of "true" and "false" in a binary bit to be processed in the fast port 18. These signals are respectively indicated as "$FBL_n$" and "$\overline{FBL}_n$".

The line 72 provides signals coding for the "x" word to be processed in the slow port 12. These signals are indicated as "$SWL_x$". In like manner, the line 68 provides signals coding for the "x" word to be processed in the fast port 18. These signals are indicated at "$FWL_x$". In other words, the logic levels of signals in the lines 60 and 66 indicate the value of the $n^{th}$ bit in the x word for the slow port and the lines 62 and 64 indicate the value of the $n^{th}$ bit in the x word for the fast port.

The signals on the line 60 are introduced to the source of an n-transistor 75, the gate of which receives signals from the line 72. The drain of the transistor 75 is connected to the drain of a p-transistor 76 and to the source of an n-transistor 78, the drain of which is connected to a suitable reference potential such as a ground 80. The gates of the transistors 76 and 78 have a common connection with the gate of an n-transistor 82. The drain of the transistor 82 may be common with the reference potential such as the ground 80. The source of the transistor 82 is connected to the drain of an n-transistor 84. The gate of the transistor 84 receives signals from the line 68 and the source of the transistor 84 receives signals from the line 62.

The line 66 is connected to the source of an n-transistor 88, the gate of which receives signals from the line 72. The drain of the transistor 88 has a common connection with the drain of a p-transistor 90 and the source of an n-transistor 92. The source of the transistor 90 receives an energizing potential such as approximately 5 volts from a suitable voltage source 94, which is also connected to the source of the transistor 76. The gates of the transistors 90 and 92 have a common connection with the drain of the transistor 76, the source of the transistor 78 and the gate of a transistor 96. The drain of the transistor 90 and the source of the transistor 92 have a common connection with the gates of the transistors 76 and 78. The drain of the transistor 96 is connected to the reference potential such as the ground 80. The source of the transistor 96 and the drain of an n-transistor 98 have a common potential. The gate of the transistor 98 receives the signals on the line 68 and the source of the transistor 98 receives the signals on the line 64.

Amplifiers 97 and 99 are respectively connected to the lines 60 and 66. The amplifiers are activated by signals on "Enable" lines. When the amplifiers 97 and 99 are enabled, they pass "write" signals through the amplifiers. The "write" signals passing through the amplifiers 97 and 99 respectively represent a binary "true" and a binary "false".

Current sources 136 and 138 are shown in FIG. 4 as being connected to the lines 62 and 64. These current sources correspond to transistors 136 and 138 in FIG. 6. Resistors 124 and 126 are shown in FIG. 4 as being respectively connected from the signal generators 136 and 138 to the reference potential such as ground. The resistors 124 and 126 are respectively shown as transistors 124 and 126 in FIG. 6. Resistances 93 and 95 are also respectively connected between the lines 60 and 66 and the voltage source 94.

The transistor 84 becomes conductive when a signal of high amplitude is produced on the line 68 to indicate the selection of a particular word, such as the "x" word, and a high signal is simultaneously produced on the line 62 (if the transistor 82 is non-conductive) to indicate a binary value of "1" for a particular bit, such as the "n" bit, in the selected word. When the transistor 84 becomes conductive, current flows through a circuit including the line 62, the transistor 84 and the transistor 82 if the transistor 82 is conductive. This current indicates that the particular bit in the selected word has a binary value of "1". A high gate impedance in the transistor 82 isolates the current in the line 62 from the reading and recording of information in the lines 60 and 66 at the "x" word and the "n" bit.

In like manner, current flows through a circuit including the line 64, the transistor 98 and the transistor 96 when a signal of high amplitude is produced on the line 68 to indicate the selection of a particular word such as the "x" word, and a signal of high amplitude is simultaneously produced (if the transistor 96 is conductive) on the line 64 to indicate a binary value of "0" for the bit, such as the "n" bit, in the $\overline{FBL}$ line in that word. A high gate impedance in the transistor 96 isolates the current in the line 64 from the reading and recording of information in the lines 60 and 66 at the "x" word and the "n" bit.

The operation of the circuitry shown in FIG. 4 may be seen from several examples. In one example, a binary value of "1" may be read by the fast port 18 in FIG. 1 at the "n" bit of the "x" word. Under such circumstances, the transistors 84 and 98 may become conductive because of the introduction of a high voltage to their gates from the line 68. Because of the interconnections between the gate of each of the transistors 76 and 90 and the drain of the other one of such transistors, the transistors 76 and 90 operate as a flip-flop. Thus, only one of the transistors 76 and 90 can be conductive at any one time. As a result, assuming that a high voltage is produced on the drain of the transistor 76, a low voltage is simultaneously produced on the drain of the transistor 90. The low voltage on the drain of the transistor 90 prevents the transistor 82 from being conductive and prevents current from flowing through a circuit including the line 62, the transistor 84 and the transistor 82.

The high voltage on the drain of the transistor 76 is introduced to the gate of the transistor 96 to make the transistor 96 conductive. This causes current to flow through a circuit including the current source 138, the line 64, the transistor 98 and the transistor 96. This current causes the current normally flowing through the resistance 126 from the signal generator 138 to be reduced. However, the current normally flowing through the current source 136 and the resistance 124 continues to be maintained because of the non-conductivity of the transistor 82. This causes the voltage on the line 64 to be reduced relative to the voltage on the line 62. This voltage difference indicates a reading of a binary "1" in the fast port 18.

In the next example, a binary "1" is read from the memory 10 by the slow port 12 at the "n" bit of the "x" word. Under such circumstances, a high voltage is introduced to the gates of the transistors 75 and 88 to provide for these transistors to become conductive. The resultant high voltage on the drain of the transistor 75 is introduced to the gate of the transistor 92 to make the transistor 92 conductive. Current accordingly flows through a circuit including the voltage source 94, the resistance 95, the transistor 88 and the transistor 92. The resultant voltage drop across the resistance 95 causes the voltage on the line 66 to be less than the voltage on the line 60. This voltage difference indicates the reading of a binary "1" by the slow port 12.

The transistor 88 has a higher impedance than the transistor 92. This causes a relatively low voltage to be produced on the source of the transistor 92. This voltage is introduced to the gate of the transistor 78 to make the transistor 78 non-conductive. As a result, current cannot flow through a circuit including the line 60, the transistor 75 and the transistor 78. This maintains the voltage on the line 60 higher than the voltage on the line 66 as discussed in the previous paragraph.

In the third example, a binary "1" is written in the memory 10 by the slow port 12 at the "n" bit of the "x" word. Because the "x" word is being activated, the voltage on the transistor 75 is high. At this instant, the amplifiers 97 and 99 are enabled by a signal on the "enabled" line. Upon being enabled, the "write" signal is introduced by the amplifier 97 to the line 60 as a positive voltage. At the same time, a voltage having the reference such as ground is introduced to the line 66 through the amplifier 99. This low voltage is introduced to the source of the transistor 88. A current is accordingly forced by the amplifier 99 to flow through a circuit including the voltage source 94, the transistor 90, the transistor 88 and the line 66.

The high voltage on the line 60 causes the transistor 75 to become conductive so that a high voltage is produced on the source of the transistor. This voltage is introduced to the gate of the transistor 92 to make the transistor 92 conductive. Current accordingly flows through a circuit including the voltage source 94, the transistor 90 and the transistor 92. Since the transistor 90 has a considerably higher impedance than the transistor 92, this current flow causes the voltage on the source of the transistor 92 to have a potential approaching the reference potential such as ground. This voltage is introduced to the gate of the transistor 78 to maintain the transistor 78 non-conductive and thereby maintain the high potential on the source of the transistor 75.

The arrangement described above is advantageous in that the same bit of information may be simultaneously read from the memory 10 (denoted as the "ram array" in FIG. 1) by the fast port 18 and the slow port 12. Actually, the fast port 18 may read the binary coded information previously recorded as the value of a particular position in the memory while the slow port 12 may be writing new binary coded information for that position in the memory. The arrangement shown in FIG. 4 accomplishes this by providing the high gate impedances in the transistors 82 and 96. These high gate impedances isolate, from the slow bit lines 60 and 66 of the slow port 12, any disturbances resulting from the reading through the fast port 18 of the binary coded information from the particular position in the memory 10. As a result, when there is a time coincidence with the writing of binary coded information through the slow port 12 in the particular position in the memory, any disturbances resulting from such reading through the fast port of the binary coded information from the particular position in the memory will be prevented from affecting the writing through the slow port 12 of such binary coded information in the particular position in the memory 10 in such a time coincidence.

Figure 5:
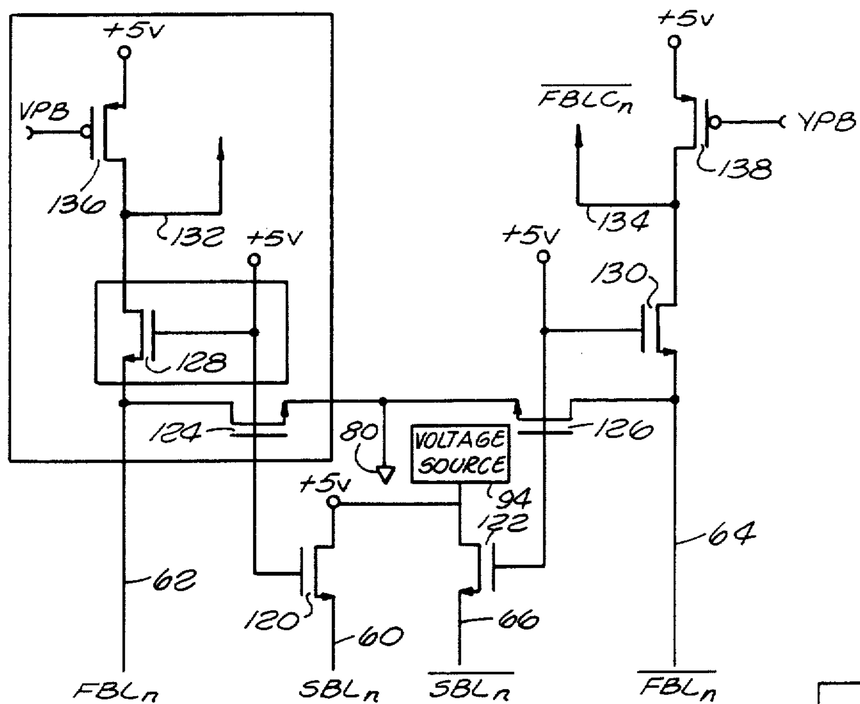
FIG. 5 is a diagram of circuitry for amplifying signals produced by the circuitry shown in FIG. 4 and for providing the amplified signals with optimal characteristics.

FIG. 5 illustrates circuitry for processing the currents flowing in the lines 60, 62, 64 and 66 in FIGS. 4 and 5 so that the signals have a common mode and the deviations of the signals from the common mode represent binary information. The circuitry shown in FIG. 5 includes the lines 60, 62, 64 and 66. The lines 60 and 66 are respectively connected to the sources of n-transistors 120 and 122 having their drains connected to the voltage source 94. Connections are respectively made from the gates of the transistors 120 and 122 to the voltage source 94. The drains of the transistors 124 and 126 are respectively connected to lines 62 and 64. The sources of the transistors 124 and 126 receive the reference potential such as the ground 80.

The gates of the transistors 120 and 122 are also respectively connected to gates of n-transistors 128 and 130 and are further connected to receive a positive potential from the voltage source 94. The sources of the transistors 128 and 130 respectively receive the signals on the lines 62 and 64. The signals on the drains of the transistors 128 and 130 are respectively applied to intermediate lines 132 and 134 and are also respectively applied to the drains of p-transistors 136 and 138. The sources of the transistors 136 and 138 have a positive potential such as +5 volts applied from the voltage source 94. The gates of the transistors 136 and 138 have a voltage bias (indicated as "VPB") applied to them to bias the transistors to produce a low current.

The transistors 128 and 130 respectively operate as cascode amplifiers. This causes a gain in the order of 1½ to 2 to be produced in each of these cascode amplifiers when a signal is introduced to a particular one of the lines 64 and 66 associated with that amplifier. The signal produced as a result of the operation of the cascode amplifier 128 is introduced to the line 132 and the signal produced as a result of the operation of the cascode amplifier 130 is introduced to the line 134.

The transistors 136 and 138 are biased, by the voltages applied to their gates, to produce a low current in the transistors at all times. The low current in the transistor 136 flows through the cascode amplifier defined by the transistor 128 and through the transistor 124 to the reference potential such as the ground 80. Similarly, the current through the transistor 138 flows through the cascode amplifier defined by the transistor 130 and through the transistor 126 to the reference potential such as the ground 80. The relatively low currents through the transistors 124 and 126 establish a common mode in the lines 62 and 64 to insure that noise in the lines is reduced. In this way, the voltage swings in these lines from the common mode represents binary information.

Figure 6:
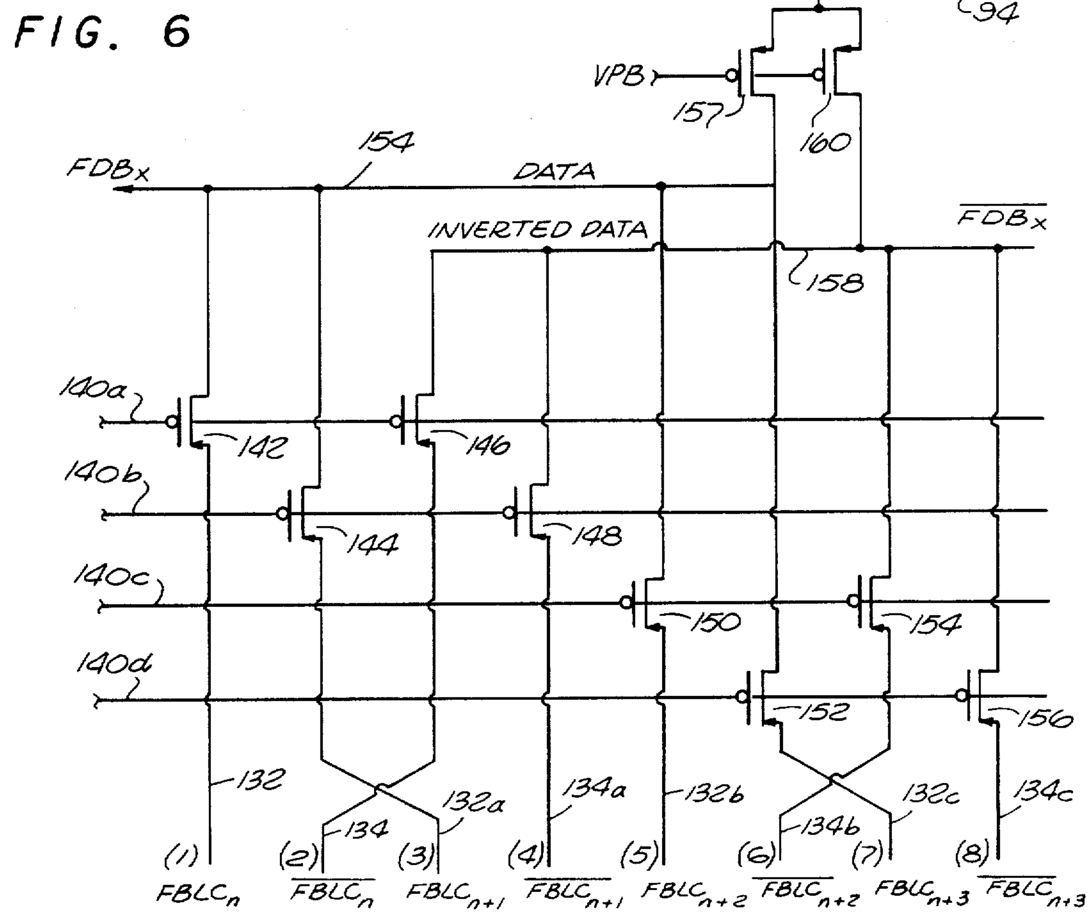
FIG. 6 is a schematic diagram of circuitry for randomly activating a plurality of channels and for introducing to a pair of buses, in accordance with the activation of the different channels, the amplified signals produced by circuitry as shown in FIG. 5.
Figure 7:
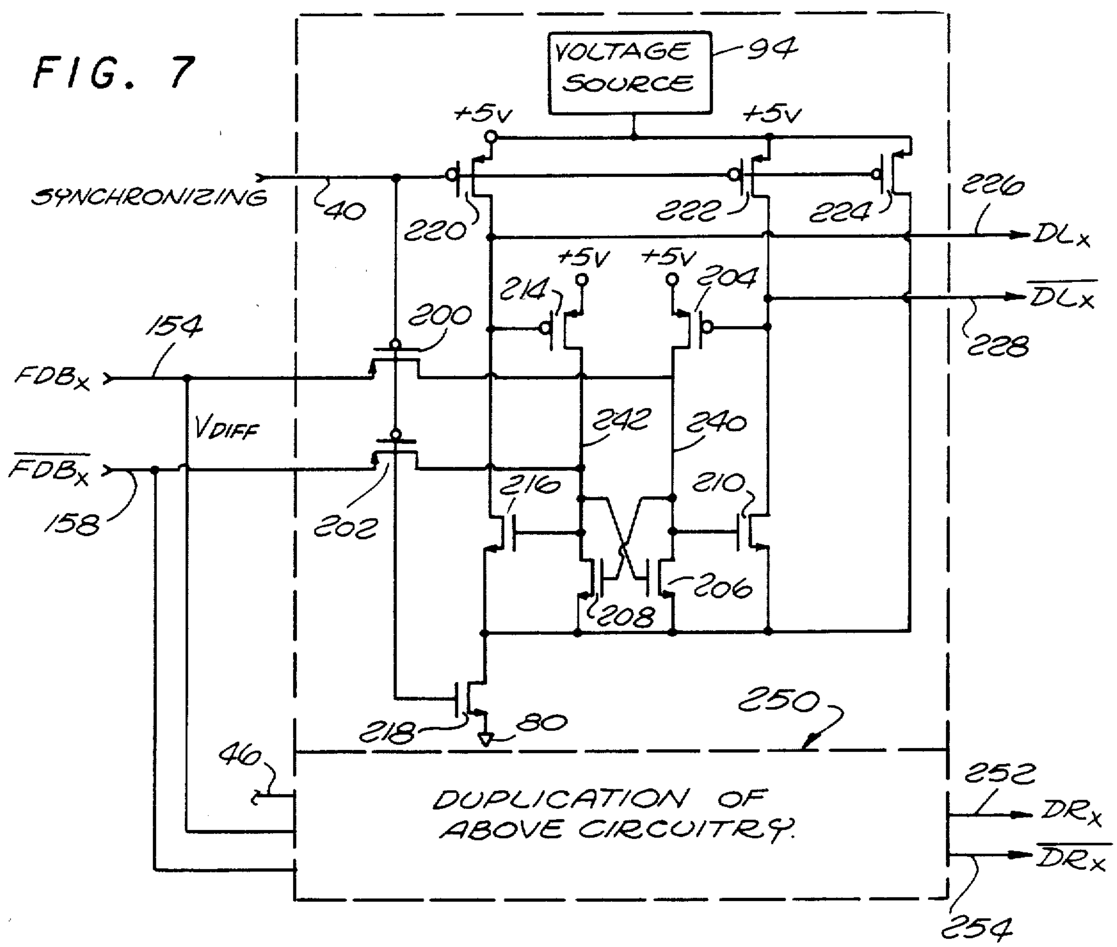
FIG. 7 is a schematic diagram of circuitry for sampling signals from the buses of FIG. 6 during the occurrence of a first polarity in the synchronizing signals and for evaluating the sampled signals upon the occurrence of a second polarity in the synchronizing signals and for introducing the evaluated signals to pairs of output lines.

The intermediate lines 132 and 134 are also shown in FIG. 6. These lines are designated in FIG. 7 as "$FBLC_n$" and "$\overline{FBLC_n}$". Other corresponding pairs of lines are indicated in FIG. 7 at 132*a* and 134*a*, (respectively designated as "$FBLC_{n+1}$" and "$FBLC_{n+1}$"), 132*b* and 134*b* (respectively designated as "$FBLC_{n+2}$" and $FBLC_{n+2}$") and 132*c* and 134*c*, (respectively designated as "$FBLC_{n+3}$" and "$FBLC_{n+3}$"). A plurality of channels are also indicated in FIG. 6 at 140*a*, 140*b*, 140*c* and 140*d*. The channels 140*a*, 140*b*, 140*c* and 140*d* operate as the equivalent of an x-y matrix with the lines 132 and 134, 132*a* and 134*a*, etc., to select a particular bit in the memory 10.

The lines 132, 134, 132*a*, 134*a*, 132*b*, 134*b*, 132*c*, and 134*c* respectively have common connections with the drains of p-transistors 142–156 (even numbers only). The signals in the channel 140*a* are introduced to the gates of the transistors 142 and 146; the signals in the channel 140*b* are introduced to the gates of the transistors 144 and 148; the signals in the channel 140*c* are introduced to the gates of the transistors 150 and 154; and the signals in the channel 140*d* are introduced to the gates of the transistors 152 and 156.

The drains of the transistors 142, 144, 150 and 152 have a common connection with a bus 154 and with the drain of a p-transistor 157. Similarly, the drains of the transistors 146, 148, 154 and 156 have a common connection with a bus 158 and with the drain of a p-transistor 160. The gates of the transistors 157 and 160 are biased to produce a current of relatively low amplitude through the transistors. A voltage is applied to the sources of the transistors from the voltage source 94.

The circuitry of FIG. 6 constitutes a switching matrix. For example, when the amplitude of the signal on the line 132 is high and the channel 140*a* is energized, current flows through the bus 154 and the transistor 142. Similarly, when a signal is produced on the line 134*a* to represent a binary "0" and the channel 140*b* is activated, current flows through the bus 158 and transistor 148.

The transistors 157 and 160 operate in a common mode similar to the operation of the transistors 124 and 126 in FIG. 5. As a result of their common mode operation, the transistors 157 and 160 insure that any variations in the voltages on the lines 154 and 158 represent binary coded information. As will be appreciated, the signals produced in the lines 154 and 158 represent signals read from the memory 10 by the fast port 10. The signals on the buses 154 and 158 are respectively represented as "$FDB_x$" and "$\overline{FDB}_x$".

The buses 154 and 158 of FIG. 6 are also shown in FIG. 7. The synchronizing signal lines 40 and 46 of FIG. 2 are also shown in FIG. 7. The signals on the lines 154 and 158 are respectively introduced to the sources of p-transistors 200 and 202 and the signals on the clock line 40 are introduced to the gates of these transistors. The drain of the transistor 200 has common connections with the drain of a p-transistor 204, the drain of an n-transistor 206, the gate of an n-transistor 208 and the gate of an n-transistor 210. Similarly, connections are made from the drain of the transistor 202 to the drain of a p-transistor 214, the drain of the transistor 208, the gate of the transistor 206 and the gate of an n-transistor 216.

The sources of the transistors 204 and 214 receive a positive potential from the voltage source 94. The sources of the transistors 206, 208, 210 and 216 have a common connection with the drain of an n-transistor 218. The source of the transistor 218 is common with the reference potential such as the ground 80. The gate of the transistor 218 receives the signals on the synchronizing line 40.

The synchronizing line 40 is also connected to the gates of p-transistors 220, 222 and 224. The sources of the transistors 220, 222 and 224 receive a positive potential from the voltage source 94. The drain of the transistor 220 has common connections with the gate of the transistor 214 and the drain of the transistor 216 and with an output line 226. The output line 226 is designated as "$DL_x$". Output connections are made from the drain of the transistor 222 to the gate of the transistor 204, the drain of the transistor 210 and an output line 228. The output line 228 is designated as "$\overline{DL}_x$". The drain of the transistor 224 has a common connection with the drain of the transistor 218.

When the amplitude of the clock signal on the line 40 is low, the transistor 200 becomes conductive. A signal of high amplitude is accordingly introduced to a line 240 common to the drain of the transistor 204 and the drain of the transistor 206. This signal has a higher amplitude than the signal on a line 242 common to the drain of the transistor 214 and the drain of the transistor 208. The reason is that the transistor 202 remains non-conductive because of a low voltage on the line 158.

Upon the occurrence of a positive polarity in the clock signal 50 on the line 40, the transistor 218 becomes conductive because of the introduction of the synchronizing signal to the gate of the transistor. This causes the voltage on the drain of the transistor 218 to decrease to substantially the reference potential such as the ground 80. Because of the high potential on the line 240, the transistor 208 becomes conductive and produces on its drain a potential approaching the reference potential such as the ground 80. This voltage is introduced to the gate of the transistor 206 to insure that the transistor 206 will remain non-conductive.

When the voltage on the drain of the transistor 218 approaches the reference potential such as the ground 80, the transistor 210 becomes conductive because of the introduction of the high voltage to its gate from the line 240. This causes the voltage on the bus 228 to approach the reference potential such as ground. The resultant reference potential, such as the ground 80, on the gate of the transistor 204 causes the transistor 204 to become conductive. This prolongs a voltage of high amplitude on the line 240 and insures that the transistors 208 and 210 will be strongly conductive.

In the next half cycle (the negative half cycle) of the synchronizing (or clock) signal 50 on the line 40, the transistors 220, 220 and 222 become conductive. When the transistors 222 and 224 become conductive, they introduce the same voltages (the voltage from the voltage source 94) to the lines 226 and 228 to assure that any difference in the potentials on these lines in the previous half cycle of the synchronizing signal is eliminated. This insures that a considerable difference in potential will be produced in the lines 226 and 228 in the subsequent half cycle (the positive half cycle) of the synchronizing signals on the line 40. When the transistor 224 becomes conductive in the negative half cycle of the synchronizing signal 50 on the line 40, it provides a positive voltage to the source of the transistor 218 to insure that the transistor will become conductive in the subsequent half cycle (the positive half cycle) of the clock signals.

When a positive signal is produced on the line 158 to indicate a binary value of "0", the signal on the line 242 has a higher amplitude than the signal on the line 240 during the negative half cycle of the synchronizing signal 50 on the line 40. As a result, when the transistor 218 becomes conductive in the next half cycle (the positive half cycle) of the synchronizing signal 50, the transistors 206 and 210 become conductive and the voltage on the line 226 approaches the reference potential such as the ground 80.

The circuitry shown in detail in FIG. 7 and described above is duplicated in second stages which are included within a box generally indicated at 250 and shown in the broken lines in FIG. 7. However, the stages 250 receive the synchronizing signals 52 on the clock line 46. Since these signals are displaced by 180° in phase from the synchronizing signals 50 on the line 46, the signals produced on output lines 252 and 254 are displaced in phase by 180° from the signals produced on the lines 226 and 228. The signals on the output lines 252 and 254 are respectively indicated as "$DR_x$" and "$\overline{DR}_x$" in FIG. 7. In other words, the signals produced in the lines 154 and 158 in one half cycle of the synchronizing signals 46 in FIG. 1 in the stage 250 are sampled while the signals produced on the lines 154 and 158 in the previous half cycles of the synchronizing signals 46 are evaluated in the output lines 226 and 228. In the next half of the synchronizing signals 46, the signals sampled in the stage 250 are evaluated in the output lines 226 and 228 while the stage shown in detail in FIG. 7 is sampling the signals on the lines 226 and 228.

Figure 8:
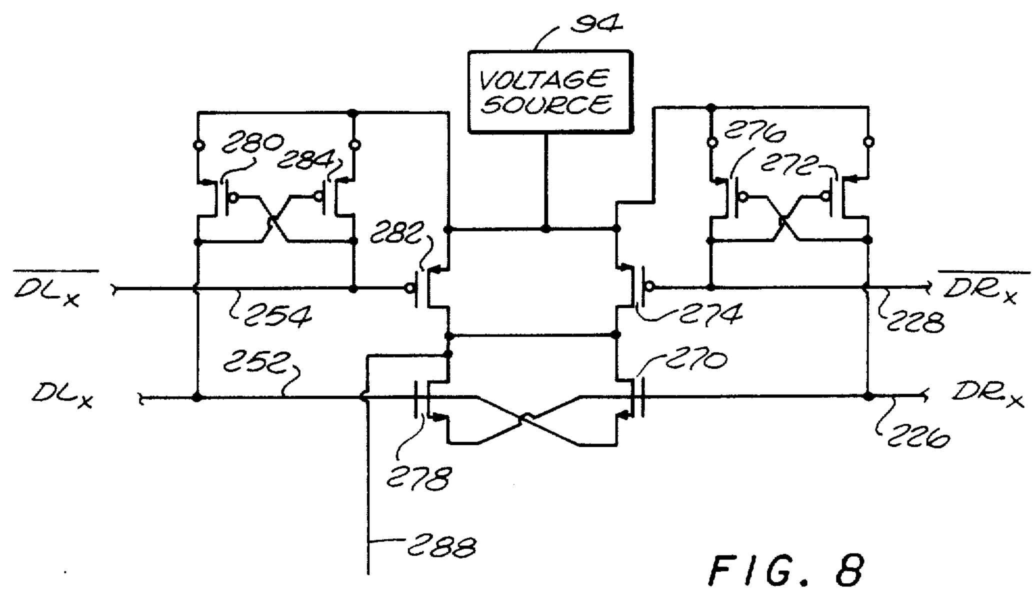
FIG. 8 is a schematic diagram of circuitry for processing the signals produced on the output lines in FIG. 7 to introduce the signals from only one of the output lines to a resultant line at each instant.

The circuitry shown in FIG. 8 includes the lines 226 and 228 and the lines 252 and 254. The lines 226, 228, 252 and 254 are respectively connected to the gates of transistors 270 and 272, the gates of transistors 274 and 276, the gates of transistors 278 and 280 and the gates of transistors 282 and 284. The transistors 270 and 278 are n-transistors and the transistors 272, 274, 276, 280, 282 and 284 are p-transistors. Connections are also respectively made from the lines 226 and 228, to the drains of the transistor 272 and the drains of the transistor 280 and 284. Similarly, the lines 252 and 254 are respectively connected to the drains of the transistors 280 and 284.

The sources of the transistors 272, 274, 276, 280, 282 and 284 receive a positive potential such as +5 volts from the voltage source 94. The drains of the transistors 274 and 282 are respectively common with the drains of the transistors 270 and 278. A resultant line 288 extends from a common connection between the drains of the transistors 270, 274, 278 and 282.

A signal of low amplitude is produced on only one of the lines 226, 228, 252 and 254 at any time to represent binary coded information and signals of relatively high amplitude are simultaneously produced on the other ones of the output lines 226, 228, 252 and 254. By way of illustration, a signal of low amplitude may be produced on the line 226 and a signal of high amplitude may be simultaneously produced on the lines 228, 252 and 254. When the amplitude of the signal on the line 226 is low, it introduces a low voltage to the source of the transistor 278. At the same time, a signal of high voltage is introduced to the gate of the transistor 278 from the line 252. This causes the transistor 278 to become conductive so that the voltage on the drain of the transistor approximates the voltage on the source of the transistor and a signal of low amplitude is produced on the resultant line 288. The low voltage on the drain of the transistor 278 also appears on the drains of the transistors 274 and 282 and the drain of the transistor 270 and prevents these transistors from becoming conductive.

To insure the operation of the transistors 270, 274, 278 and 282 as discussed above, the signals on the lines 226 and 228 are respectively introduced to the transistors 272 and 276. These signals prevent the transistor 272 from becoming conductive and cause the transistor 276 to become conductive. This causes a high voltage to be produced on the drain of the transistor 276 and to be introduced to the gate of the transistor 274 to prevent the transistor 274 from becoming conductive.

It may sometimes happen that a signal of low amplitude is produced on the line 228. At the same time, signals of high amplitude are produced on the lines 226, 252 and 254. The signal of low amplitude on the line 228 is introduced to the gate of the transistor 274 to make the transistor conductive. This causes the drain of the transistor 274 to have a high voltage, this voltage being introduced to the resultant line 288. At the same time, the transistors 270 and 278 are not conductive. The reason is that each of these transistors has the same voltage on its gate and its source because of the high voltages on the lines 226 and 252. The transistor 282 is not conductive because a high voltage is introduced to its gate from the line 254.

The transistors 272 and 276 operate to insure that the transistors 270, 274, 278 and 282 will operate as discussed in the previous paragraphs when the line 228 has a signal of low amplitude and the lines 226, 252 and 254 have signals of high amplitude. These signals prevent the transistor 276 from become conductive and cause the transistor 272 to become conductive. The resultant high voltage on the drain of the transistor 272 insures that the transistor 270 will remain non-conductive.

As will be seen, the circuit shown in FIG. 8 is symmetrical in that the lines 226 and 252 have the same connections and the lines 228 and 254 have the same connections. As a result, the discussion above with respect to the introduction of a signal of low amplitude on the line 226 is applicable to the introduction of a signal of low amplitude on the line 252. Similarly, the discussion above with respect to the introduction of a signal on the line 228 is also applicable to the introduction of a signal on the line 254.

The invention described above has certain important advantages. It provides for the reading of binary coded information from the memory 10 by the fast port 18 at the same time that binary coded information is read from, or written into, the memory 10 by the slow port 12. The simultaneous read and/or writing action is obtained by the fast port 18 and the slow port 12 without obtaining any interference between the actions of the fast and slow ports. This results from the operation of the circuitry shown in FIG. 4 and described above. Actually, both the fast port 18 and the slow port 12 may simultaneously read the same bit of information from the memory.

The invention described above also has other important advantages. It provides for the reading of binary coded information by the fast port 18 on a synchronous basis with signals from the clock signal generator 30 but provides for the reading or writing of binary coded information by the slow port 12 on an asynchronous basis relative to the clock signals. This synchronous-asynchronous relationship between the operation of the fast port 18 and the slow port 12 is especially significant because the reading of binary coded information from the fast port 18 occurs at a high frequency such as approximately one hundred and twenty five megahertz (125 mhz).

The operation of the fast port 18 also offers other important advantages in addition to those specified above. For example, the fast port 18 reads binary coded information from the random access memory 10 in each half cycle of the synchronizing signals 50 and 52 shown in FIG. 3. The fast port 18 samples, in a first stage, first bits of such binary coded information in the negative half cycles of the synchronizing signals 50 and evaluates the sampled information in the positive half cycles of the such synchronizing signals. The fast port 18 samples, in a second stage identical in construction to the first stage, second bits of such binary coded information in the positive half cycles of the signals 52 and evaluates such sampled information in the negative half cycles of such synchronizing signals.

In this way, the frequency of the fast port 18 in reading binary coded information from the memory 10 is effectively doubled without any loss in the ability to read such information. The stages (FIG. 7) sampling and evaluating the binary coded information read by the fast port 18 from the memory 10 also operate advantageously in prolonging the evaluation of the sampled signals in the next half cycles after each such sampling. The circuitry shown in FIG. 8 then introduces such evaluated signals to the resultant line 288 on an exclusive basis whereby the signal from only one of the output lines 226, 228, 252, and 254 can be introduced to the resultant line at each instant.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

I claim:

1. In a combination for reading and writing binary coded information for video display, first signal means for passing first signals having first and second logic levels respectively corresponding to binary "1" and "0", second signal means for passing second signals having first and second logic levels respectively corresponding to binary "1" and "0", memory means having a plurality of positions for storing binary coded information, first means operatively coupled to the first signal means and the memory means for writing binary coded information in a particular position in the memory means dependent upon the logic levels of the first signals from the first signal means and for reading binary coded information from the particular position in the memory means and transferring such information to the first signal means as the first signals, second means operatively coupled to the memory means and the second signal means for reading binary coded information from the particular position in the memory means and transferring such binary coded information to the second signal means as the second signals, and third means operatively coupled to the first and second means for isolating any disturbances resulting from the reading through the second means of the binary coded information from the particular position in the memory means such that, in a time coincidence with the writing of binary coded information through the first means to the particular position in the memory means, any such disturbances resulting from the reading through the second means of the binary coded information from the particular position in the memory means will be prevented from affecting such writing through the first means to the particular position in the memory means.

2. In a combination as set forth in claim 1, the third means including high input impedance isolation means having an input coupled to the first means and an output coupled to the second means for isolating any disturbances resulting from the reading through the second means of the binary coded information from the particular position in the memory means such that, in a time coincidence with the writing through the first means of binary coded information to the particular position in the memory means, any such disturbances resulting from the reading through the second means of the binary coded information from the particular position in the memory means will be prevented from affecting such writing through the first means to the particular position in the memory means.

3. In a combination as set forth in claim 2, the high input impedance isolation means in the third means including a semiconductor having non-conductive and conductive states and operative in the conductive state dependent upon the signals through the first means.

4. In a combination for reading and writing binary coded information for video display, a random access memory having a plurality of positions for storing binary coded information, first means for producing clock signals, second means for reading binary coded information from a particular position in the random access memory on a synchronous basis with the clock signals, third means for selectively reading binary coded information from, or writing binary coded information to, the particular position in the random access memory on an asynchronous basis relative to the clock signals, and fourth means operatively coupled to the second means and the third means for isolating any disturbances resulting from the synchronous reading through the second means of the binary coded information from the particular position in the random access memory such that, in a time coincidence with the asynchronous writing of binary coded information through the third means to the particular position in the memory means, any such disturbances resulting from the reading through the second means of the binary coded information from the particular position in the random access memory will be prevented from affecting such asynchronous writing through the third means to the particular position in the random access memory.

5. In a combination as set forth in claim 4, the second means including fifth means for sampling binary coded information read from the particular position in the random access memory in alternate cycles of the clock signals and for evaluating such sampled binary coded information in other cycles of the clock signals and sixth means for sampling binary coded information read from the particular position in the random access memory in the other cycles of the clock signals and for evaluating such sampled binary coded information in the alternate cycles of the clock signals.

6. In a combination as set forth in claim 5, seventh means for providing for a common mode rejection of noise in the binary coded information passing through the second means, and eighth means for providing a low amplification of such binary coded information after the common mode rejection by the seventh means of noise in the binary coded information passing through the second means.

7. In a combination as set forth in claim 5, a first output line, means responsive to the binary coded information sampled and evaluated by the fifth means for producing on the first output line signals having a binary value representing such evaluated binary coded information, a second output line, means responsive to the binary coded information sampled and evaluated by the sixth means for producing on the second output line signals having a binary value representing such evaluated binary coded information, a resultant line, and means for introducing on an exclusive basis to the resultant line signals having a binary value corresponding to the signals produced on either the first or the second output lines so that only one of such signals is produced on the resultant line at any one time.

8. In a combination for reading and writing binary coded information for video display, a random access memory having a plurality of positions for storing information, a first port for reading information from a selected position in the random access memory, a second port for reading information from the selected position in the random access memory and writing information in the selected position in the random access memory, first means for providing clock signals, second means for enabling a selective one of the reading through the second port of information from, and the writing through the second port of information to, the selected position in the random access memory on an asynchronous basis relative to the clock signals, third means for enabling the reading of information through the first port from the selected position in the random access memory on a synchronous basis relative to the clock signals, and fourth means operatively coupled to the second and third means for isolating any disturbances resulting from the synchronous reading through the first port of information from the selected position in the random access memory such that, in a time coincidence with the asynchronous writing of information through the second port to the selected position in the random access memory, any such disturbances resulting from the reading through the first port of information from the selected position in the random access memory will be prevented from affecting such asynchronous writing through the second port to the selected position in the random access memory.

9. In a combination as set forth in claim 8, the fourth means including semi-conductor means operatively coupled to the second and third means for providing a high input impedance isolating any disturbances resulting from the synchronous reading through the first port of information from the selected position in the random access memory such that, in a time coincidence with the asynchronous writing of information through the second port to the selected position in the random access memory, any such disturbances resulting from the synchronous reading through the first port of information from the selected position in the random access memory will be prevented from affecting such asynchronous writing through the second port to the selected position in the random access memory.

10. In a combination for reading and writing binary coded information for video display, memory means having a plurality of positions for storing binary coded information, a first port for reading binary coded information from a particular position in the memory means, a second port for reading binary coded information from, and writing binary coded information to, the particular position in the memory means, first means for providing clock signals, second means responsive to the clock signals for synchronizing, with the clock signals, the reading through the first port of the binary coded information from the particular position in the memory means, third means for providing an operation of the second port asynchronously with respect to the clock signals, and fourth means for isolating any disturbances resulting from the synchronous reading through the first port of the binary coded information from the particular position in the memory means such that, in a time coincidence with the asynchronous writing of binary coded information through the second port to the particular position in the memory means, any such disturbances resulting from the synchronous reading through the first port of the binary coded information from the particular position in the memory means will be prevented from affecting such asynchronous writing through the second port to the particular position in the memory means.

11. In a combination as set forth in claim 10, means associated with the first port for providing for the reading of binary coded information through the first port from the memory in successive half cycles of the clock signals.

12. In a combination as set forth in claim 1, the third means including amplifier means having a high input impedance and having an input and an output, the input of the amplifier means being operatively coupled to the first means and the output of the amplifier means being operatively coupled to the second means for isolating any disturbances resulting from the reading through the second means of the binary coded information from the particular position in the memory means such that, in a time coincidence with the writing of binary coded information through the first means to the particular position in the memory means, any such disturbances resulting from the reading through the second means of the binary coded information from the particular position in the memory means will be prevented from affecting such writing through the first means to the particular position in the memory means.

13. In a combination as set forth in claim 4, the fourth means including amplifier means having a high input impedance and operatively coupled to the second and third means for isolating any disturbances resulting from the synchronous reading through the second means of binary coded information from the particular position in the random access memory such that, in a time coincidence with the asynchronous writing of binary coded information to the particular position in the random access memory through the third means, any such disturbances resulting from the synchronous reading through the second means of binary coded information from the particular position in the random access memory will be prevented from affecting such asynchronous writing through the third means to the particular position in the random access memory.

14. In a combination as set forth in claim 13, the amplifier means in the fourth means having conductive and non-conductive states and providing a high impedance connection to the second means in the conductive state.

15. In a combination as recited in claim 9, the semi-conductor means being operatively connected to the first port for providing a high input impedance isolating any disturbances resulting from the synchronous reading of information through the first port of information from the particular position in the random access memory such that, in a time coincidence with the asynchronous writing of information through the second port of information to the particular position in the random access memory, any such disturbances resulting from the synchronous reading of information through the first port of information from the particular position in the random access memory will be prevented from affecting such asynchronous writing through the second port to the particular position in the random access memory.

16. In a combination as set forth in claim 10, the fourth means including high input impedance amplifiers operatively coupled to the first port and the second port for preventing the reading of binary coded information from the particular position in the memory through the first port from affecting the selective one of the reading or writing in time coincidence of binary coded information through the second port respectively from or to the particular position in the memory.

17. In a combination as set forth in claim 10, the fourth means including semiconductor means associated with the first port for providing, in accordance with the reading and writing of information through the second port, for the isolation of any disturbances resulting from the synchronous reading of information through the first port relative to the asynchronous writing of information through the second port.

18. In a combination as recited in claim 1, means responsive to the binary coded information passing through the second means from the memory means for providing a rejection of noise in such binary coded information.

19. In a combination as recited in claim 4, means responsive to the binary coded information passing through the second means from the memory means for providing a rejection of noise in such binary coded information.

20. In a combination as recited in claim 12, means responsive to the binary coded information passing through the second means from the memory means for providing a common mode rejection of noise in such binary coded information.

21. In a combination as recited in claim 13, means responsive to the binary coded information passing through the second means from the memory means for providing a common mode rejection of noise in such binary coded information.

22. In a combination as recited in claim 8, means responsive to the information passing through the first port from the selected position in the memory for providing a common mode rejection of noise in such information.

23. In a combination for reading and writing binary coded information for video display, memory means having a plurality of positions for storing binary coded information, a first port for reading binary coded information from a particular position in the memory means, a second port for writing binary coded information to the particular position in the memory means and reading binary coded information from the particular position in the memory means, a source of reference potential, and semi-conductor means for isolating any disturbances resulting from the reading through the first port of the binary coded information from the particular position in the memory means such that, in a time coincidence with the writing through the second port of binary coded information to the particular position in the memory means, any such disturbances resulting from the reading through the first port of the binary coded information from the particular position in the memory means will be prevented from affecting such writing through the second port to the particular position in the memory means, the semi-conductor means having first, second and third terminals, the first terminals of the semi-conductor means being connected to the first port and the second terminals of the semi-conductor means being connected to the second port and the third terminals of the semi-conductor means being connected to the source of reference potential.

24. In a combination as set forth in claim 23, means for providing clock signals, operation of the first port being synchronous with respect to the clock signals, and operation of the second port being asynchronous with respect to the clock signals.

25. In a combination as set forth in claim 23, the semi-conductor means having conductive and non-conductive states and providing a high impedence connection to the second port to isolate the second port when the first port reads binary coded information from the particular position in the memory means in time coincidence with the selective one of the reading or writing of binary coded information through the second port respectively from or to the particular position of the memory means.

26. In a combination for reading and writing a particular bit of binary coded information in a particular word for video display, memory means having a plurality of positions for storing binary coded information, first and second lines for reading binary coded information from a particular position in the memory means, third and fourth lines for selectively reading and writing binary coded information from or to the particular position in the memory means, a fifth line for passing binary logic signals to select the particular word to be read through the first and second lines, a sixth line for passing binary logic signals to select the particular word to be read through the third and fourth lines, first, second, third, fourth, fifth and sixth semiconductors each having conductive and non-conductive states, the first semi-conductor having conductive and non-conductive states and being operatively coupled to the first and fifth lines to become conductive in accordance with the logic level of the signals in the fifth line, the second semi-conductor having conductive and non-conductive states and being operatively coupled to the second and fifth lines to become conductive in accordance with the logic level of the signals in the fifth line, flip-flop means having first and second states of operation and constructed to pass signals to and from the flip-flop means, the third semi-conductor being operatively coupled to the third and sixth lines to become conductive in accordance with the logic level of the signals in the sixth line and being operatively coupled to the flip-flop means to pass signals to and from the flip-flop means, the fourth semi-conductor being operatively coupled to the fourth and sixth lines to become conductive in accordance with the logic level of the signals in the sixth line and being operatively coupled to the flip-flop means to pass signals to and from the flip-flop means, the flip-flop means being operative in a particular one of the first and second states in accordance with the signals respectively passing from the third and fourth lines through the third and fourth semi-conductors in the conductive states of the third and fourth semi-conductors, and, the fifth semi-conductor being operatively coupled to the first semi-conductor and to the flip-flop means to become conductive when the flip-flop means is in a particular one of the first and second states of operation and the first semi-conductor is in the conductive state, the sixth semi-conductor being operatively coupled to the second semi-conductor and to the flip-flop means to become conductive when the flip-flop means is in the other one of the first and second states of operation and the second semi-conductor is in the conductive state.

27. In a combination as set forth in claim 26, the fifth semi-conductor being constructed to provide a high input impedance connection to the flip-flop means, the sixth semi-conductor being constructed to provide a high input impedance connection to the flip-flop means.

28. In a combination as set forth in claim 27, means for providing clock signals, sensing and evaluating means for reading the binary coded information on the first and second lines synchronously with respect to the clock signals, means for providing a synchronization between the clock signals and the binary logic signals on the fifth line, and means for providing the binary logic signals on the sixth line asynchronously with respect to the clock signals.

29. In a combination as set forth in claim 26, the coupling of the third line to the third semi-conductor providing for the passage of a signal through the third line to the third semi-conductor.

first write amplifier means having enabled and disabled states and connected to the third line for passing a signal, upon becoming enabled, through the third line to the third semi-conductor to write binary coded information to the particular bit in the particular word, the coupling of the fourth line to the fourth semi-conductor providing for the passage of a signal through the fourth line to the fourth semi-conductor.

second write amplifier means having enabled and disabled states and connected to the fourth line for passing a signal, upon becoming enabled, through the fourth line to the fourth semi-conductor to write binary coded information to the particular bit in the particular word, and means for introducing a signal to the first and second write amplifier means to enable such amplifier means.

30. In a combination as set forth in claim 29, a pair of cascode read amplifiers each having an input and an output, the inputs to the cascode amplifiers being connected to the first and second lines to provide a low signal gain of the binary coded information from the inputs to the outputs of the cascode amplifiers and to electrically isolate the outputs of the cascode amplifiers from the inputs to the cascode amplifiers, and a pair of semi-conductor means operatively coupled to the cascode amplifiers and to the first and second lines to provide a common mode rejection of noise in the signals passing through the first and second lines.

31. In a combination as set forth in claim 28, the coupling of the third line to the third semi-conductor providing for the passage of a signal through the third line to the third semi-conductor, first write amplifier means having enabled and disabled states and connected to the third line for passing a signal, upon becoming enabled, through the third line to the third semi-conductor to write binary coded information to the particular bit in the particular word, the coupling of the fourth line to the fourth semi-conductor providing for the passage of a signal through the fourth line to the fourth semi-conductor, second write amplifier means having enabled and disabled states and connected to the fourth line for passing a signal, upon becoming enabled, through the fourth line to the fourth semi-conductor to write binary coded information to the particular bit in the particular word, means for introducing a signal to the first and second amplifier means to enable such amplifier means, a pair of cascode read amplifiers each having an input and an output, the inputs of the cascode amplifiers being connected to the first and second lines to provide a low signal gain of the binary coded information from the inputs to the outputs of the cascode amplifiers and to electrically isolate the outputs of the cascode amplifiers from the inputs to the cascode amplifiers, and a pair of semi-conductor means operatively coupled to the cascode amplifiers and to the first and second lines to provide a common mode rejection of noise in the signals passing through the first and second lines.

32. In a combination for reading and writing binary coded information in a particular bit in a particular word for video display, memory means having a plurality of positions for storing binary coded information, first and second means for reading binary coded information for the particular bit from a particular position in the memory means, third and fourth means for selectively reading or writing binary coded information for the particular bit respectively from or to the particular position in the memory means, a flip-flop means operatively coupled to the third and fourth means for selectively providing voltages to, and receiving voltages from, the third and fourth means in accordance with the selective one of the reading or writing of binary coded information for the particular bit respectively from or to the particular position in the memory means, a source of reference potential, first and second transistors each having a source, a drain and a gate, the sources of the first and second transistors being respectively connected to the first and second means and the gates of the first and second transistors being respectively connected to the flip-flop means and the drains of the first and second transistors being connected to the source of the reference potential, the first and second transistors being operative to isolate any disturbances resulting from the reading through the first and second means of the binary coded information from the particular position in the memory such that, in a time coincidence with the writing of the binary coded information through the third and fourth means to the particular position in the memory means, any such disturbances resulting from the reading through the first and second means of a binary coded information from the particular position in the memory means will be prevented from affecting such writing through the third and fourth means to the particular position in the memory means.

33. In a combination as set forth in claim 32, the first and second transistors having high gate impedances to isolate any disturbances resulting from the reading of binary coded information through the first and second means from the particular position in the memory means such that, in a time coincidence with writing of binary coded information through the third and fourth means to the particular position in the memory means, any disturbances resulting from the reading through the first and second means of the binary coded information from the particular position in the memory means will be prevented from affecting such writing of binary coded information through the third and fourth means to the particular position in the memory means.

34. In a combination as set forth in claim 32, means for providing clock signals, means for synchronizing the operation of the first and second means with the clock signals, the operation of the third and fourth means and the flip-flop means being asynchronous with respect to the clock signals.

35. In a combination as set forth in claim 34, the first and second transistors having high gate impedances to isolate any disturbances resulting from the reading of binary coded information through the first and second means from the particular position in the memory means such that, in a time coincidence with the writing of binary coded information through the third and fourth means to the particular position in the memory means, any such disturbances resulting from the reading through the first and second means of the binary coded information from the particular position in the memory means will be prevented from affecting such writing of binary coded information through the third and fourth means to the particular position in the memory means, the first and second transistors being n-type transistors.

36. In a combination as set forth in claim 35, the first and second means including a pair of n-type transistors, the third and fourth means including a pair of n-type transistors, and the flip-flop means being defined by first and second pairs of transistors, the transistors in the first pair being cross coupled to the transistors in the second pair, one of the transistors in each of the first and second pairs being n-type and the other of the transistors in each of the first and second pairs being p-type.

37. In a combination as set forth in claim 36, each of the n-type transistors in the first and second means including a gate, a source and a drain, and means for introducing, to the gates of the transistors in the first and second means, binary coded information representing the particular word, means for introducing, to the sources of the transistors in the first and second means, binary coded information representing the particular bit, the drains of the transistors in the first and second means being respectively connected to the sources of the first and second transistors.

38. In a combination as set forth in claim 35, each of the n-type transistors in the third and fourth means including a gate, a source and a drain, means for introducing, to the gates of the transistors, in the third and fourth means, binary coded information representing the particular word, and means for introducing, to the sources of the transistors in the third and fourth means, binary coded information representing the particular bit, the drains of the transistors in the third and fourth means being connected to the flip-flop means to control the operation of the flip-flop means in the first and second states.

39. In a combination as set forth in claim 36, means operatively coupled to the first and second means for providing for a common mode rejection of noise in the binary coded information passing through the first and second means, and cascode amplifier means for amplifying the binary coded information passing through the first and second means and for electrically isolating the amplifier binary coded information from the first and second means.

40. In a combination as set forth in claim 36, the clock signals having positive and negative half cycles, means for sampling the binary coded information from the first and second means in the positive half cycles of the clock signals and for evaluating the sampled binary coded information in the negative half cycles of the clock signals, and means for sampling the binary coded information from the first and second means in the negative half cycles of the clock signals and for evaluating the sampled binary coded information in the positive half cycles of the clock signals.

* * * * *

US004905189B1

REEXAMINATION CERTIFICATE (2030th)

United States Patent [19]

[11] B1 4,905,189

Brunolli

[45] Certificate Issued Jun. 1, 1993

[54] SYSTEM FOR READING AND WRITING INFORMATION

[75] Inventor: Michael J. Brunolli, Escondido, Calif.

[73] Assignee: Brooktree Corporation, San Diego, Calif.

Reexamination Request:
No. 90/002,242, Jan. 4, 1991

Reexamination Certificate for:

| | |
|---|---|
| Patent No.: | **4,905,189** |
| Issued: | **Feb. 27, 1990** |
| Appl. No.: | **810,911** |
| Filed: | **Dec. 18, 1985** |

[51] Int. Cl.[5] .................... G11C 7/00
[52] U.S. Cl. .................... 395/162; 365/189.01; 365/189.04
[58] Field of Search .................... 364/200, 900; 365/189.01, 189.04; 395/162

[56] References Cited

PUBLICATIONS

Pope, Kendall W.; Asynchronous Dual-Port RAM Simplifies Multiprocessor Systems; EDN Electrical Design News, vol. 28 (1983), Sep., No. 18, Boston, Mass., pp. 147-154.
SY2130/SY2131 1024×8 Dual Port Random Access Memory, Synertek, pp. 1-31.
Heller, et al., High Sensitivity Charge—Transfer Sense Amplifier, IEEE Journal of Solid—State Circuits, vol. SC-11, No. 5, Oct., 1976, pp. 596-601.

*Primary Examiner*—Thomas C. Lee

[57] ABSTRACT

First binary bits are read synchronously relative to clock signals (e.g. 125 MH$_2$) from first memory positions and second binary bits are read from, or written in, second memory positions asynchronously relative to the clock signals without affecting the reading of the first memory bits. For synchronously reading the first bits, a plurality of channels are sequentially activated at a suitable frequency (e.g. 25 megahertz). Information from pairs of data lines are introduced into a pair of buses at the clock frequency. The information in the buses is sampled upon the occurrence of the first polarity in synchronizing signals having frequency (e.g. 62.5 MH$_3$) derived from the clock signals and is prolonged and evaluated in a first pair of output lines upon the occurrence of the second polarity in the synchronizing signals. The information being evaluated is introduced to such output lines during the occurrence of the first polarity in the synchronizing signals. The evaluated signals on such output lines are then neutralized upon the occurrence of the first polarity in such synchronizing signals. Similarly, the information in the buses is sampled upon the occurrence of the second polarity in the synchronizing signals and is prolonged and evaluated in a second pair of output lines upon the occurrence of the first polarity in the synchronizing signals. The evaluated signals on all of the output lines are then processed on an exclusive basis to insure that only one of the evaluated signals can be introduced at any one time to a resultant line.

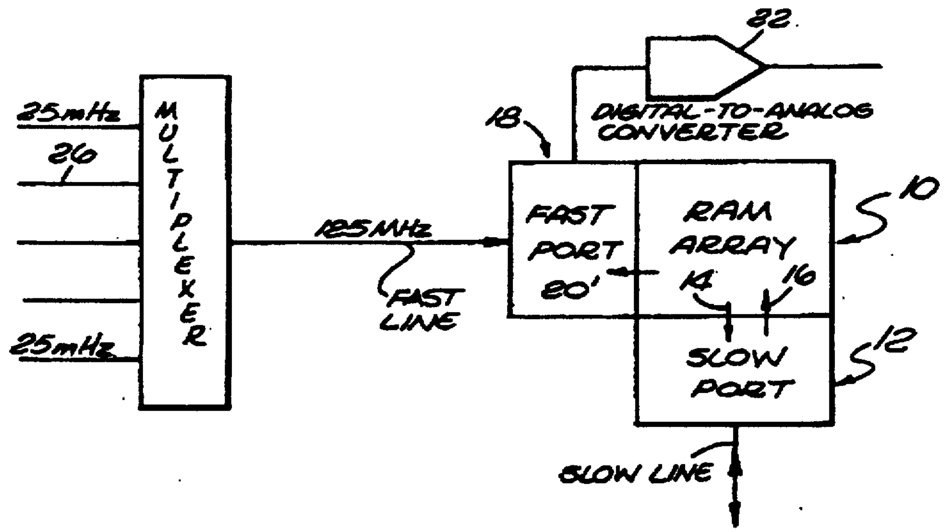

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 4–11, 13–17, 19, 21 and 22 is confirmed.

Claims 1, 23, 24, 26, 28, 32, and 34 are determined to be patentable as amended.

Claims 2, 3, 12, 18, 20, 25, 27, 29–31, 33 and 35–40, dependent on an amended claim, are determined to be patentable.

New claims 41–56 are added and determined to be patentable.

1. In a combination for reading and writing binary coded information for video display, first signal means for passing first signals having first and second logic levels respectively corresponding to binary "1" and "0", second signal means for passing second signals having first and second logic levels respectively corresponding to binary "1" and "0", memory means having a plurality of positions for storing binary coded information, first means operatively coupled to the first signal means and the memory means for writing binary coded information in a particular position in the memory means dependent upon the logic levels of the first signals from the first signal means and for reading binary coded information from the particular position in the memory means and transferring such information to the first signal means as the first signals, second means operatively coupled to the memory means and the second signal means for reading binary coded information from the particular position in the memory means and transferring such binary coded information to the second signal means as the second signals, [and]

*the operation of the first means being asynchronous to the operation of the second means, and* third means operatively coupled to the first and second means for isolating any disturbances resulting from the reading through the second means of the binary coded information from the particular position in the memory means such that, in a time coincidence with the writing of binary coded information through the first means to the particular position in the memory means, any such disturbances resulting from the reading through the second means of the binary coded information from the particular position in the memory means will be prevented from affecting such writing through the first means to the particular position in the memory means.

23. In a combination for reading and writing binary coded information for video display, memory means having a plurality of positions for storing binary coded information, a first port for reading binary coded information from a particular position in the memory means, a second port for writing binary coded information to the particular position in the memory means and reading binary coded information from the particular position in the memory means,

*the operation of the second port being asynchronous with respect to the operation of the first port,* a source of reference potential, and semi-conductor means for isolating any disturbances resulting from the reading through the first port of the binary coded information from the particular position in the memory means such that, in a time coincidence with the writing through the second port of binary coded information to the particular position in the memory means, any such disturbances resulting from the reading through the first port of the binary coded information from the particular position in the memory means will be prevented from affecting such writing through the second port to the particular position in the memory means, the semi-conductor means having first, second and third terminals, the first terminals of the semi-conductor means being connected to the first port and the second terminals of the semi-conductor means being connected to the second port and the third terminals of the semi-conductor means being connected to the source of reference potential.

24. [In a combination as set forth in claim 23,]

*In a combination for reading and writing binary coded information for video display,*

*memory means having a plurality of positions for storing binary coded information,*

*a first port for reading binary coded information from a particular position in the memory means,*

*a second port for writing binary coded information to the particular position in the memory means and reading binarycoded information from the particular position in the memory means,*

*a source of reference potential,*

*semi-conductor means for isolating any disturbances resulting from the reading through the first port of the binary coded information from the particular position in the memory means such that, in a time coincidence with the writing through the second port of binary coded information to the particular position in the memory means, any such disturbances resulting from the reading through the first port of the binary coded information from the particular position in the memory means will be prevented from affecting such writing through the second port to the particular position in the memory means,*

*the semi-conductor means having first, second and third terminals, the first terminals of the semi-conductor means being connected to the first port and the second terminals of the semi-conductor means being connected to the second port and the third terminals of the semi-conductor means being connected to the source of reference potential,* means for providing clock signals, operation of the first port being asynchronous with respect to the clock signals, and operation of the second port being asynchronous with respect to the clock signals.

26. In a combination for reading and writing a particular bit of binary coded information in a particular word for video display, memory means having a plurality of positions for storing binary coded information, first and second lines for reading binary coded information from a particular position in the memory means, third and fourth lines for selectively reading and writing binary coded information from or to the particular position in the memory means, a fifth line for passing binary logic signals to select the particular word to be read through the first and second lines, a sixth line for passing binary logic signals to select the particular word to be *written or* read through the third and fourth lines, first, second, third, fourth, fifth and sixth semiconductors each having conductive and non-conductive states, the first semi-conductor having conductive and non-conductive states and being operatively coupled to the first and fifth lines to become conductive in accordance with the logic level of the signals in the fifth line, the second semi-conductor having conductive and non-conductive states and being operatively coupled to the second and fifth lines to become conductive in accordance with the logic level of the signals in the fifth line, flip-flop means having first and second states of operation and constructed to pass signals to and from the flip-flop means, the third semi-conductor being operatively coupled to the third and sixth lines to become conductive in accordance with the logic level of the signals in the sixth line and being operatively coupled to the flip-flop means to pass signals to and from the flip-flop means, the fourth semi-conductor being operatively coupled to the fourth and sixth lines to become conductive in accordance with the logic level of the signals in the sixth line and being operatively coupled to the flip-flop means to pass signals to and from the flip-flop means, the flip-flop means being operative in a particular one of the first and second states in accordance with the signals respectively passing from the third and fourth lines through the third and fourth semi-conductors in the conductive states of the third and fourth semi-conductors, [and]

the fifth semi-conductor being operatively coupled to the first semi-conductor and to the flip-flop means to become conductive when the flip-flop means is in a particular one of the first and second states of operation and the first semi-conductor is in the conductive state, the sixth semi-conductor being operatively coupled to the second semi-conductor and to the flip-flop means to become conductive when the flip-flop means is in the other one of the first and second states of operation and the second semi-conductor is in the conductive state,

*means for providing for the reading of the binary coded information on the first and second lines from the particular position in the memory means at a particular clock rate, and*

*means for providing for the selective reading and writing of the binary coded information from or to the particular position in the memory means to or from the third and fourth lines at a rate asynchronous with respect to the particular clock rate.*

28. [In a combination as set fourth in claim 27,] *In a combination for reading and writing a particular bit of binary coded information in a particular word for video display,*

*memory means having a plurality of positions for storing binary coded information,*

*first and second lines for reading binary coded information from a particular position in the memory means,*

*third and fourth lines for selectively reading and writing binary coded information from or to the particular position in the memory means,*

*a fifth line for passing binary logic signals to select the particular word to be read through the first and second lines,*

*a sixth line for passing binary logic signals to select the particular word to be written or read through the third and fourth lines,*

*first, second, third, fourth, fifth and sixth semiconductors each having conductive and non-conductive states,*

*the first semi-conductor having conductive and non-conductive states and being operatively coupled to the first and fifth lines to become conductive in accordance with the logic level of the signals in the fifth line,*

*the second semi-conductor having conductive and non-conductive states and being operatively coupled to the second and fifth lines to become conductive in accordance with the logic level of the signals in the fifth line,*

*flip-flop means having first and second states of operation and constructed to pass signals to and from the flip-flop means,*

*third semi-conductor being operatively coupled to the third and sixth lines to become conductive in accordance with the logic level of the signals in the sixth line and being operatively coupled to the flip-flop means to pass signals to and from the flip-flop means,*

*the fourth semi-conductor being operatively coupled to the fourth and sixth lines to become conductive in accordance with the logic level of the signals in the sixth line and being operatively coupled to the flip-flop means to pass signals to and from the flip-flop means,*

*the flip-flop means being operative in a particular one of the first and second states in accordance with the signals respectively passing from the third and fourth lines through the third and fourth semi-conductors in the conductive states of the third and fourth semi-conductors,*

*the fifth semi-conductor being operatively coupled to the first semi-conductor and to the flip-flop means to become conductive when the flip-flop means is in a particular one of the first and second states of operation and the first semi-conductor is in the conductive state,*

*the sixth semi-conductor being operatively coupled to the second semi-conductor and to the flip-flop means to become conductive when the flip-flop means is in the other one of the first and second states of operation*

*and the second semi-conductor is in the conductive state,*

*the fifth semi-conductor being constructed to provide a high input impedance connection to the flip-flop means,*

*the sixth semi-conductor being constructed to provide a high input impedance connection to the flip-flop means,* means for providing clock signals, sensing and evaluating means for reading the binary coded information on the first and second lines synchronously with respect to the clock signals, means for providing a synchronization between the clock signals and the binary logic signals on the fifth line, and means for providing the binary logic signals on the sixth line asynchronously with respect to the clock signals.

32. In a combination for reading and writing binary coded information in a particular bit in a particular word for video display, memory means having a plurality of positions for storing binary coded information, first and second means for reading binary coded information for the particular bit from a particular position in the memory means, third and fourth means for selectively reading or writing binary coded information for the particular bit respectively from or to the particular position in the memory means,

[a] flip-flop means operatively coupled to the third and fourth means for selectively providing voltages to, and receiving voltages from, the third and fourth means in accordance with the selective one of the [reading] *writing* or [writing] *reading* of binary coded information for the particular bit respectively [from] *to* or [to] *from* the particular position in the memory means.

a source of reference potential, first and second transistors each having a source, a drain and a gate, the source of the first and second transistors being respectively connected to the first and second means and the gates of the first and second transistors being respectively connected to the flip-flop means and the drains of the first and second transistors being connected to the source of the reference potential, the first and second transistors being operative to isolate any disturbances resulting from the reading through the first and second means of the binary coded information from the particular position in the memory *means* such that, in a time coincidence with the writing of the binary coded information through the third and fourth means to the particular position in the memory means, any such disturbances resulting from the reading through the first and second means of [a] binary coded information from the particular position in the memory means will be prevented from affecting such writing through the third and fourth means to the particular position in the memory means,

*means for providing for the reading by the first and second means of the binary coded information at a particular clock rate from the particular position in the memory means, and*

*means for providing for the selective reading or writing of binary coded information by the third and fourth means, at a rate asynchronous with respect to the particular clock rate, respectively from or to the particular position in the memory means.*

34. [In a combination as set forth in claim 32,] *In a combination for reading and writing binary coded information in a particular bit in a particular word for video display,*

*memory means having a plurality of positions for storing binary coded information,*

*first and second means for reading binary coded information for the particular bit from a particular position in the memory means,*

*third and fourth means for selectively reading or writing binary coded information for the particular bit respectively from or to the particular position in the memory means,*

*flip-flop means operatively coupled to the third and fourth means for selectively providing voltages to, and receiving voltages from, the third and fourth means in accordance with the selective one of the writing or reading of binary coded information for the particular bit respectively to or from the particular position in the memory means,*

*a source of reference potential,*

*first and second transistors each having a source, a drain and a gate, the sources of the first and second transistors being respectively connected to the first and second means and the gates of the first and second transistors being respectively connected to the flip-flop means and the drains of the first and second transistors being connected to the source of the reference potential,*

*the first and second transistors being operative to isolate any disturbances resulting from the reading through the first and second means of the binary coded information from the particular position in the memory means such that, in a time coincidence with the writing of the binary coded information through the third and fourth means to the particular position in the memory means, any such disturbances resulting from the reading through the first and second means of a binary coded information from the particular position in the memory means will be prevented from affecting such writing through the third and fourth means to the particular position in the memory means,* means for providing clock signals, means for synchronizing the operation of the first and second means with the clock signals, the operation of the third and fourth means and the flip-flop means being asynchronous with respect to the clock signals.

*41. In a combination as set forth in claim 1,*

*the second signal means passing the second signals at a particular frequency,*

*means for dividing the frequency of the second signals by two to obtain clock signals at a reduced frequency,*

*means for sampling the binary coded information in alternate half cycles of the clock signals at the reduced frequency and for evaluating the sampled binary coded information in the other half cycles of the clock signals at the reduced frequency, and*

*means for sampling the binary coded information in the other half cycles of the clock signals at the reduced frequency and for evaluating the sampled binary coded information in the alternate half cycles of the clock signals at the reduced frequency.*

*42. In a combination as set forth in claim 1,*

*the second signal means having first and second differentially connected lines for passing the second signals,*

*common mode rejection means respectively connected to the first and second differentially connected lines to pass only the differential signals in the lines, and*

*cascode amplifier means respectively connected to the first and second differentially connected lines and having first and second output lines for respectively isolating the binary coded information in the first and second output lines from the binary coded information on the first and second differentially connected lines.*

*43. In a combination as set forth in claim 42,*

*a source of a reference potential,*

*the common mode rejection means includingg first and second transistors each respectively having a source, a drain and a gate, the sources of the first and second transistors being respectively connected to the first and second differentially connected lines, the gates of the first and second transistors receiving a substantially constant biasing voltage for producing a flow of a current through the first and second transistors and the drains of the first and second transistors being connected to the source of the reference potential.*

*44. In a combination as set forth in claim 43,*

*the second signal means passing the second signals at a particular frequency,*

*means for dividing the frequency of the second signals by two to obtain clock signals with a reduced frequency,*

*means for sampling the binary coded information in alternate half cycles of the clock signals at the reducedfrequency and for evaluating the sampled binary coded information in the other half cycles of the clock signals at the reduced frequency, and*

*means for sampling the binary coded information in the other half cycles of the clock signals at the reduced frequency and for evaluating the sampled binary coded information in the alternate half cycles of the clock signals at the reduced frequency.*

*45. In a combination as set forth in claim 8,*

*the first port having first and second lines differentially connected for reading the information at the selected position in the random access memory,*

*fifth and sixth means respectively connected to the first and second lines for providing a rejection of information common to the first and second lines, and*

*seventh and eighth means respectively connected to the first and second lines for providing a cascode amplification of the information differentially in the first and second lines and having third and fourth lines respectively at the output of the seventh and eighth means for providing outputs differentially representing the differential information on the first and second lines, the seventh and eighth means being operative to isolate the third and fourth lines respectively from the first and second lines.*

*46. In a combination as set forth in claim 45,*

*the seventh and eighth means respectively including first and second transistors each having a source, a drain and a gate, the sources of the first and second transistors being respectively common with the first and second lines, the gates of the first and second transistors receiving a substantially constant bias voltage for providing for a flow of a current through the first and second transistors and the drains of the first and second transistors being respectively connected to the third and fourth lines.*

*47. In a combination as set forth in claim 46,*

*the clock signals constituting first clock signals,*

*means for obtaining second clock signals having a frequency half of the frequency of the first clock signals,*

*ninth means for sampling the information on the third and fourth lines during alternate half cycles of the second clock signals and for evaluating the sampled information during the other half cycles of the second clock signals, and*

*tenth means for sampling the information on the third and fourth liens during the other half cycles of the second clock signals and for evaluating the sampled information during the other half cycles of the second clock signals.*

*48. In a combination as set forth in claim 23,*

*there being first and second differentially connected lines associated with the first port for reading the binary coded information from the particular position in the memory means, and*

*semi-conductor means connected to the first and second differentially connected lines for providing a constant current from the first and second lines to the source of reference potential to provide for the passage through the first and second lines only of differential information between the lines.*

*49. In a combination as set forth in claim 24,*

*there being first and second differentially connected lines associated with the first port for reading the binary coded information from the particular position in the memory means,*

*the semi-conductor means including first and second transistors each having first, second and third terminals, the first terminals of each of the first and second transistors being connected to one of the ports and the second terminals of each of the first and second transistors being connected to the other port and the third terminals of the first and second transistors being connected to the source of reference potential,*

*third and fourth transistors each having first, second and third terminals, the first terminals of the third and fourth transistors being respectively connected to the first and second differentially connected lines and the second terminals of the third and fourth transistors receiving a substantially constant bias voltage to produce a current through the third and fourth transistors and the third terminals of the third and fourth transistors receiving the reference potential.*

*50. In a combination as set forth in claim 49,*

*fifth and sixth transistors each having first, second and third termianls, the first and second differentially connected lines being respectively connected to the third terminals of the fifth and sixth transistors, thesecond terminals of the fifth and sixth transistors being biased to provide a state of conductivity in the fifth and sixth transistors and a low amplification gain in the fifth and sixth transistors and the first and second output lines being respectively connected to the first terminals of the fifth and sixth transistors.*

*51. In a combination as set forth in claim 24,*

*means for providing second clock signals at a particular frequency,*

*the operation of the first port being synchronous with respect to the second clock signals,*

*the operation of the second port being asynchronous with respect to the second clock signals,*

*means for providing third clock signals having half of the particular frequency,*

*means for sampling the binary coded information read by the first port in alternate half cycles of the third clock signals and for evaluating the sampled information in the other half of the third clock signals, and*

*means for sampling the binary coded information read by the first port in the other half cycles of the third clock signals and for evaluating the sampled information in the alternate half cycles of the third clock signals.*

*52. In a combination as set forth in claim 51,*

*there being first and second differentially connected lines associated with the first port for reading the binary coded information stored in the particular position in the memory means,*

*the semi-conductor means including first and second transistors each having first, second and third terminals, the first terminals of each of the first and second transistors being connected to one of the ports and the second terminals of each of the first and second transistors being connected to the other port and the third terminals of the first and second transistors being connected to the reference potential,*

*third and fourth transistors each having first, second and third terminals, the first terminals of the third and fourth transistors being respectively connected to the first and second differentially connected lines and the second terminals of the third and fourth transistors receiving a substantially constant bias voltage to produce a current through the third and fourth transistors and the third terminals of the third and fourth transistors receiving the reference potential,*

*fifth and sixth transistors each having first, second and third terminals, the first and second differentially connected lines being respectively connected to the third terminals of the fifth and sixth transistors, the second terminals of the fifth and sixth transistors being biased to provide a state of conductivity in the fifth and sixth transistors and a low amplification gain in the fifth and sixth transistors, and*

*first and second output lines respectively connected to the first terminals of the fifth and sixth transistors.*

*53. In a combination as set forth in claim 46,*

*a source of energizing voltage,*

*third and fourth transistors each having a source, a gate and a drain, the drains of the third and fourth transistors being respectively connected to the drains of the first and second transistors, the sources of the first and second transistors being respectively connected to the source of energizing voltage and the gates of the third and fourth transistors being biased to produce a low current through the third and fourth transistors.*

*54. In a combination as set forth in claim 53,*

*fifth and sixth transistors each having a source, a drain and a gate, the drains of the fifth and sixth transistors being respectively connected to the first and second differentially connected lines, the gates of the fifth and sixth transistors being biased to produce a flow of current through the transistors and the sources of the fifth and sixth transistors receiving a reference potential.*

*55. In a combination as set forth in claim 50,*

*a source of energizing voltage,*

*seventh and eighth transistors each having first, second and third terminals, the first terminals of the seventh and eighth transistors being respectively connected to the first terminals of the fifth and sixth transistors, the third terminals of the seventh and eighth transistors being connected to the source of energizing voltage and the second terminals of the seventh and eighth transistors receiving a biasing potential to provide for a low current through the seventh and eighth transistors.*

*56. In a combination as set forth in claim 52,*

*a source of energizing voltage,*

*seventh and eighth transistors each having first, second and third terminals, the first terminals of the seventh and eighth transistors being respectively connected to the first terminals of the fifth and sixth transistors, the third terminals of the seventh and eighth transistors being connected to the source of energizing voltage and the second terminals of the seventh and eighth transistors receiving a biasing potential to provide for a low current through the seventh and eighth transistors.*

* * * * *